(12) United States Patent
Miyazaki et al.

(10) Patent No.: US 10,481,232 B2
(45) Date of Patent: Nov. 19, 2019

(54) MAGNETIC RESONANCE IMAGING APPARATUS AND MAGNETIC RESONANCE IMAGING METHOD

(71) Applicant: Toshiba Medical Systems Corporation, Otawara-shi (JP)

(72) Inventors: Mitsue Miyazaki, Otawara (JP); Cheng Ouyang, Vernon Hills, IL (US)

(73) Assignee: Canon Medical Systems Corporation, Otawara-shi (JP)

( * ) Notice: Subject to any disclaimer, the term of this patent is extended or adjusted under 35 U.S.C. 154(b) by 273 days.

(21) Appl. No.: 15/487,099

(22) Filed: Apr. 13, 2017

(65) Prior Publication Data
US 2018/0299525 A1    Oct. 18, 2018

(51) Int. Cl.
| | | |
|---|---|---|
| *G01V 3/00* | (2006.01) | |
| *G01R 33/56* | (2006.01) | |
| *G01R 33/48* | (2006.01) | |
| *G01R 33/54* | (2006.01) | |
| *G01R 33/561* | (2006.01) | |

(52) U.S. Cl.
CPC ....... *G01R 33/5605* (2013.01); *G01R 33/482* (2013.01); *G01R 33/4824* (2013.01); *G01R 33/546* (2013.01); *G01R 33/5619* (2013.01)

(58) Field of Classification Search
CPC .................................................. G01R 33/5605
USPC ........................................ 324/309, 307, 306
See application file for complete search history.

(56) References Cited

U.S. PATENT DOCUMENTS

| | | | |
|---|---|---|---|
| 9,562,959 | B2 | 2/2017 | Miyazaki et al. |
| 10,004,422 | B2 * | 6/2018 | Alsop ................ G01R 33/5601 |
| 10,048,340 | B2 * | 8/2018 | Sun .................... G01R 33/4833 |
| 2008/0309336 | A1 | 12/2008 | Griswold et al. |
| 2014/0347051 | A1 | 11/2014 | Kecskemeti et al. |
| 2014/0361776 | A1 | 12/2014 | Miyazaki et al. |
| 2015/0219735 | A1 | 8/2015 | Miyazaki et al. |
| 2015/0226823 | A1 | 8/2015 | Speier |
| 2017/0199258 | A1 * | 7/2017 | Beck ................. G01R 33/4818 |

FOREIGN PATENT DOCUMENTS

JP        2014-46209 A        3/2014

* cited by examiner

*Primary Examiner* — Louis M Arana
(74) *Attorney, Agent, or Firm* — Oblon, McClelland, Maier & Neustadt, L.L.P.

(57) ABSTRACT

A magnetic resonance imaging apparatus according to an embodiment includes sequence control circuitry. The sequence control circuitry executes a first pulse sequence that acquires data by radial sampling. The sequence control circuitry executes a second pulse sequence a plurality of times by changing a frequency of magnetization transfer (MT) pulses, the second pulse sequence acquiring data by Cartesian sampling after applying an MT pulse.

10 Claims, 11 Drawing Sheets

FIG.9
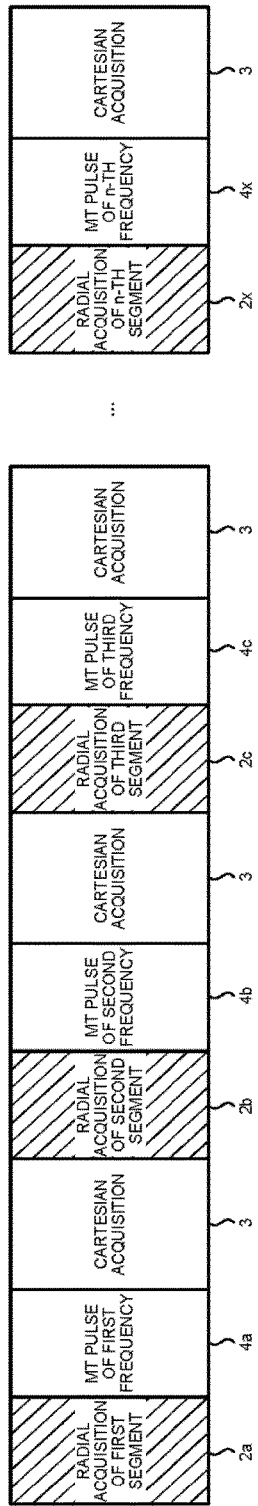
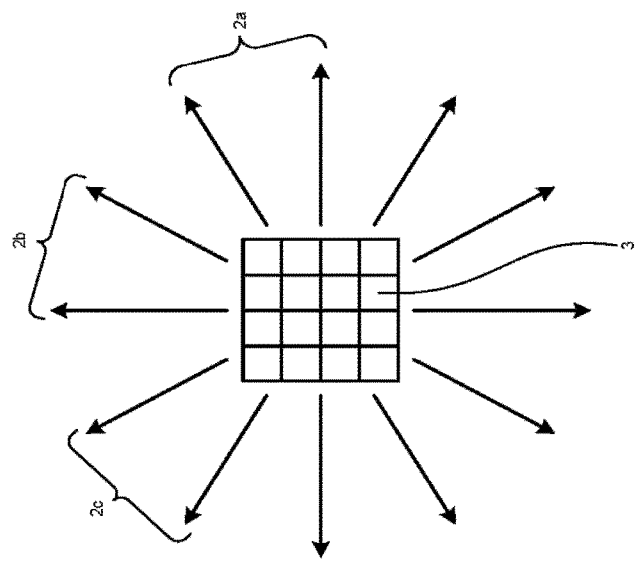

MAGNETIC RESONANCE IMAGING APPARATUS AND MAGNETIC RESONANCE IMAGING METHOD

FIELD

Embodiments described herein relate generally to a magnetic resonance imaging apparatus and a magnetic resonance imaging method.

BACKGROUND

In magnetic resonance imaging, a method is known in which a chemical exchange saturation transfer (CEST) effect is utilized. In this method, magnetization transfer (MT) pulses that correspond to a resonance frequency of protons that are other than free-water protons are applied as saturation pulses. Subsequently, a radio frequency (RF) pulse corresponding to the resonance frequency of the free-water protons is applied. Subsequently, signals of the free-water protons are acquired when a predetermined time has passed. By this method, data corresponding to magnetization transfer from so-called exchangeable protons such as protons of amide group (—NH), hydroxyl group (—OH) or amino group (—NH$_2$) to free-water protons can be acquired.

However, pulse sequences housing the CEST scan is time-consuming in general when it comes to imaging.

BRIEF DESCRIPTION OF THE DRAWINGS

FIG. 9 is a drawing illustrating data acquisition in a fourth embodiment;

DETAILED DESCRIPTION

A magnetic resonance imaging apparatus according to an embodiment includes sequence control circuitry. The sequence control circuitry executes a first pulse sequence that acquires data by radial acquisition. The sequence control circuitry executes a second pulse sequence a plurality of times by changing a frequency of magnetization transfer (MT) pulses, the second pulse sequences acquiring data by Cartesian acquisition after applying an MT pulse.

Hereafter, embodiments of the present invention described with reference to the drawings. Common numeral signs are assigned to the same components in different figures and duplicated explanations are omitted.

First Embodiment

Figure 1:
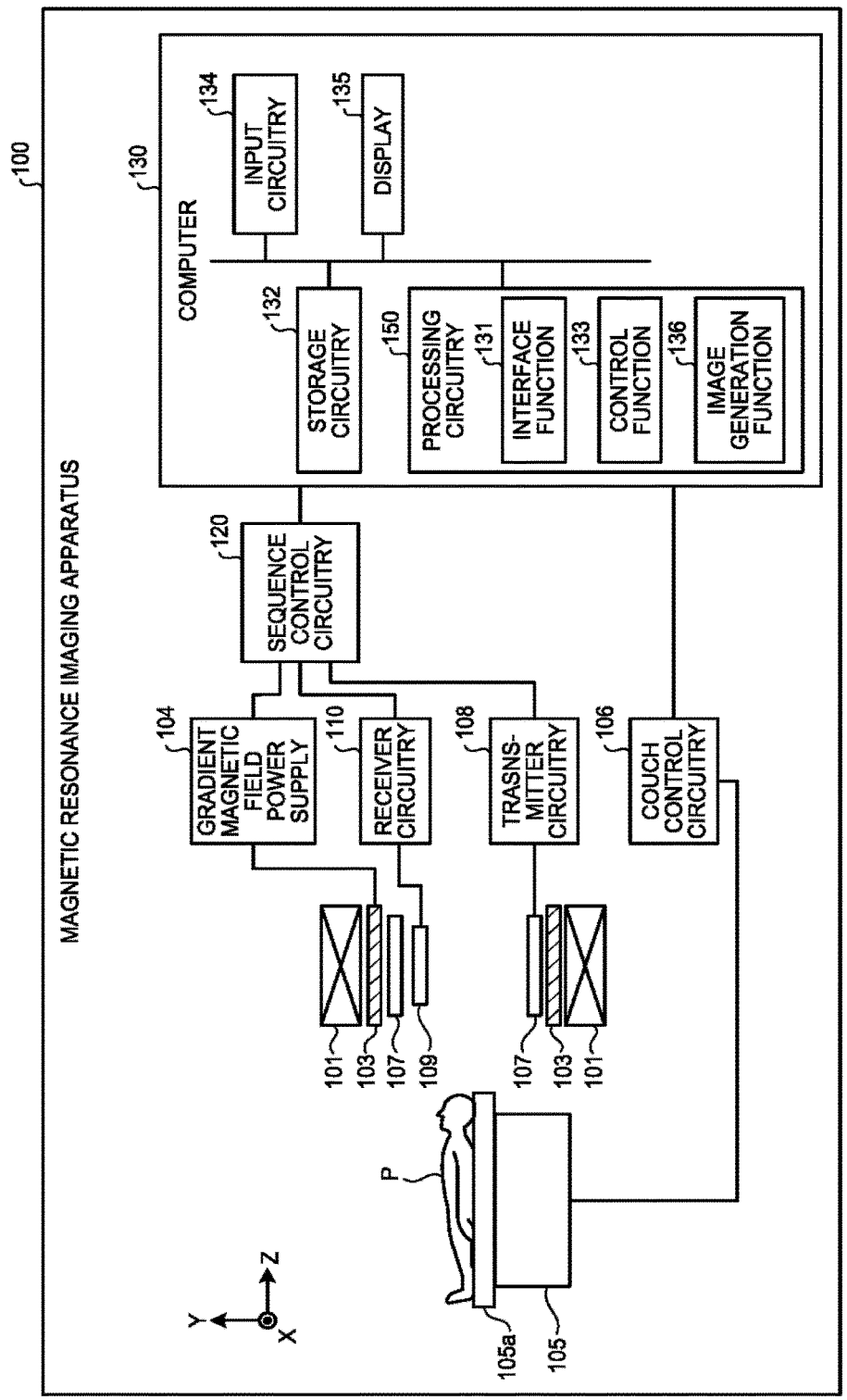
FIG. 1 is a diagram illustrating a magnetic resonance imaging apparatus according to an embodiment.

FIG. 1 is a block diagram of a magnetic resonance imaging apparatus 100 according to a first embodiment. As illustrated in FIG. 1, the magnetic resonance imaging apparatus 100 includes a static magnetic field magnet 101, a static magnetic field power source (not illustrated), a gradient coil 103, a gradient magnetic field power source 104, a couch 105, couch control circuitry 106, a transmitter coil 107, transmitter circuitry 106, a receiver coil 109, receiver circuitry 110, sequence control circuitry 110, and a computer 130 (which may be called an "image processing apparatus"). The magnetic resonance imaging apparatus 100 does not include an examined subject (such as a human body) P. The configuration illustrated in FIG. 1 is merely an example. In another example, any of the unit included in the sequence control circuitry 12C and the computer 130 may be integrated together or separated, as appropriate.

The static magnetic field magnet 101 is a magnet formed in the shape of a substantially hollow circular cylinder and generates a static magnetic field in a space on an inside thereof. The static magnetic field magnet 101 may be configured by using, for example, a superconducting magnet and is magnetically excited by receiving supply of electric current from the static magnetic field power source. The static magnetic field power source supplies electric current to the static magnetic field magnet 101. Alternatively, the static magnetic field magnet 101 may be a permanent magnet, in which case the magnetic resonance imaging apparatus 100 need not comprise the static magnetic field power supply Further, the static magnetic field power source may be provided separately from the magnetic resonance imaging apparatus 100.

The gradient coil 103 is a coil formed in a shape of a substantially hollow circular cylinder and is disposed on an inside of the static magnetic field magnet 101. The gradient coil 103 is formed by combining three coils corresponding to X-, Y-, and Z-axes that are orthogonal to one another. These three coils individually receive supply of electric current from the gradient magnetic field power source 104 and generate gradient magnetic fields of which the magnetic field intensities change along the X-, Y-, and Z-axes. The gradient magnetic fields on the X-, Y-, and Z-axes that are generated by the gradient coil 103 correspond to, for example, a slice encode gradient magnetic field Gs, a phase encode gradient magnetic field Ge, and a readout gradient magnetic field Gr, respectively. The gradient magnetic field power source 104 supplies the electric current to the gradient coil 103.

The couch 105 includes a couchtop 105a on which the subject P is placed. Under control of the couch control circuitry 106, while the subject P is placed thereon, the couchtop 105a is inserted into a hollow (i.e., an image taking opening) of the gradient coil 103. Normally, the couch 105 is provided so that a longitudinal direction thereof extends parallel to a central axis of the static magnetic field magnet 101. Under control of the computer 130, the couch control circuitry 106 drives the couch 105 so that the couchtop 105a moves in longitudinal directions and in up-and-down directions.

The transmitter coil 107 is disposed on an inside of the gradient coil 103 and generates a radio frequency magnetic field by receiving a supply of a radio frequency (RF) pulse from the transmitter circuitry 108. The transmitter circuitry 108 supplies an RF pulse corresponding to Larmor frequency determined by a type of targeted atoms and magnetic field intensities, to the transmitter coil 107.

The receiver coil 109 is disposed on an inside of the gradient coil 103 and receives magnetic resonance signals (hereinafter, "MR signals", as necessary) emitters from the subject P subjected to an influence of a radio frequency magnetic field. Upon reception of magnetic resonance signals, the receiver coil 109 outputs the received magnetic resonance signals to the receiver circuitry 110.

The transmitter coil 107 and the receiver coil 109 described above are mere examples. The configuration thereof may be realized by selecting one of the following or combining together two or more of the following: a coil having only a transmission function; a coil having only a reception function; and a coil having transmission and reception functions.

The receiver circuitry 110 detects the magnetic resonance signals output from the receiver coil 109 and generates magnetic resonance data based on the detected magnetic resonance signals. More specifically, the receiver circuitry 110 generates the magnetic resonance data by applying a digital conversion to the magnetic resonance signals output from the receiver coil 109. Further, the receiver circuitry 110 transmits the generated magnetic resonance data to the sequence control circuitry 120. The receiver circuitry 110 may be provided on a gantry device side where the static magnetic field magnet 101, the gradient coil 103, and the like are provided.

The sequence control circuitry 120 images the subject P, by driving the gradient magnetic field power source 104, the transmitter circuitry 108, and the receiver circuitry 110, on the basis of sequence information transmitted from the computer 130. The sequence information is information that defines a procedure of the imaging. The sequence information defines: an intensity of electric current to be supplied from the gradient magnetic field power source 104 to the gradient coil 103 and a timing with which electric current is to be supplied; an intensity of an RE pulse to be supplied by the transmitter circuitry 108 to the transmitter coil 107 and the timing with which an RF pulse is to be applied; a timing with which magnetic resonance signals are to be detected by the receiver circuitry 110, and the like. The sequence control circuitry 120 may be configured with an integrated circuit such as an Application Specific Integrated Circuit (ASIC) or a Field Programmable Gate Array (FPGA) or an electronic circuit such as a Central Processing Unit (CPU) or a Micro Processing Unit (MPU). It is noted that the details of the pulse sequences executed by the sequence control circuitry 120 will be described later.

Further, upon reception of magnetic resonance data from the receiver circuitry 110 as a result of imaging of the subject P by driving the gradient magnetic field power source 104, the transmitter circuitry 108, and the receiver circuitry 110, the sequence control circuitry 120 forwards the received magnetic resonance data to the computer 130.

The computer 130 exercises overall control of the magnetic resonance imaging apparatus 100, or generates an image, and the like. The computer 130 comprises storage circuitry 132, input circuitry 134, a display 135 and processing circuitry 150. The processing circuitry 150 includes an interface function 131, a control function 133 and an image generation function 136.

In the first embodiment, each processing function carried out at the interface function 131, the control function 133, the image generation function 136, is stored in the storage circuitry 132 in a form of an executable program by a computer. The processing circuitry 150 is a processor realizing a function corresponding to each program by reading a program from the storage circuitry 132 and thereafter executing the program. In other words, the processing circuitry 150 in a state of having read each program has each function illustrated within the processing circuitry 150 in FIG. 1. It is noted that, in FIG. 1, it is explained that the single processing circuitry 150 realizes the processing function carried out at the interface function 131, the control function 133, or the image generation function 136. However, a plurality of independent processors may constitute the processing circuitry 150, each processor of the processing circuitry 150 executing its own program. In other words, each function described above may constitute a program and the single processing circuitry may execute each program. Alternatively, a specific function may be implemented in an independent program execution circuitry dedicated for the specific function.

Terminology "processor" used in the above explanation is meant to refer to, for example, CPU (Central Processing Unit), GPU (Graphical Processing Unit), or ASIC (Application Specific Integrated Circuit), circuitry such as programmable logic device (i.e. SPLD (Simple Programmable Logic Device), CPLD (Complex Programmable Logic Device) and FPGA (Field Programmable Gate Array). A processor reads and executes a program stored in the storage circuitry 132, thereby realizing the function.

Further, instead of being stored in the storage circuitry 132, a program may be constructed such that it is directly incorporated within circuitry of a processor. In that situation, the processor realizes a function by reading and executing the program incorporated within the circuitry. The couch control circuitry 106, the transmitter circuitry 108, the receiver circuitry 110 may be constructed as well, with a use of electronic circuits such as processors described above.

The processing circuitry 150 sends sequence information to the sequence control circuitry 120 by the interface function 131 and receives magnetic resonance data from the sequence control circuitry 120. Further, upon reception of the magnetic resonance data, the processing circuitry 150 stores the received magnetic resonance data into the storage circuitry 132 by the interface function 131. When receiving the magnetic resonance data, the processing circuitry 150 having the interface function 131 stores the received magnetic resonance data in the storage circuitry 132.

The magnetic resonance data stored in the storage circuitry 132 is arranged into a k-space by the control function 133. As a result, the storage circuitry 132 stores therein k-space data.

The storage circuitry 132 stores therein the magnetic resonance data received by the processing circuitry 150 that has the interface function 131, the k-space data arranged in the k-space by the processing circuitry 150 having the control function 133, image data generated by the processing circuitry 150 having the image generation function 136, and the like. For example, the storage circuitry 132 is configured by using a Random Access Memory (RAM), a semiconductor memory element such as a flash memory, a hard disk, an optical disc, and the like.

The input circuitry 134 receives various types of instructions and inputs of information from an operator. For example, the input circuitry 134 is a pointing device such as a mouse or a trackball, a selecting device such as a mode changing switch, or an input device such as a keyboard. Under the control of the processing circuitry 150 that has the control function 133, the display 135 displays Graphical User Interface (GUI) used for receiving an input of an image taking condition and an image generated by the processing circuitry 150 that has the image generation function 136, and the like. For example, the display 135 is a display device such as a liquid crystal display device.

The processing circuitry 150 exercises overall control of the magnetic resonance imaging apparatus 100 by the control function 133 and controls image capturing processing, image generation processing, image display processing, and the like. For example, the processing circuitry 150 that has the control function 133 receives an input of the image taking condition (e.g., an image taking parameter) via the GUI and generates sequence information according to the received image taking condition. Further, the processing circuitry 150 that has the control function 133 transmits the generated sequence information to the sequence control circuitry 120.

The processing circuitry 150 reads a k-space data from the storage circuitry 132 by the image generation function 136 and generates an image through a reconstructing process such as Fourier transform on the read k-space data.

Next, background regarding a magnetic resonance imaging apparatus according to an embodiment is briefly explained.

In magnetic resonance imaging, a method is known in which the chemical exchange saturation transfer (CEST) effect is utilized. In this method, magnetization transfer (MT) pulses that correspond to a resonance frequency of protons that are other than free-water protons are applied as saturation pulses. Subsequently, a radio frequency (RF) pulse corresponding to the resonance frequency of the free-water protons is applied. Subsequently, signals of the free-water protons are acquired when a predetermined time has passed. By this method, data corresponding to the magnetization transfer from so-called exchangeable protons such as protons of amide group (—NH), hydroxyl group (—OH) or amino group (—NH$_2$) to free-water protons can be acquired.

However, since the CEST scan pulse sequences are executed by gradually changing the MT pulse frequency, they are time-consuming in general. For example, in a case in which an ultrashort echo time (UTE) sequence capable of depicting the ultrashort T$_2$ component is employed as an imaging sequence and the pulse sequence is executed by gradually changing the MT pulse frequency, if you plan to perform the imaging by changing the frequency by 0.5 ppm for each time, starting from −10 ppm to 10 ppm, it would cost about 30 minutes in total for the imaging time.

The magnetic resonance imaging apparatus 100 according to an embodiment is based on this background. Specifically, the sequence control circuitry 120 executes a first pulse sequence that acquires data by radial sampling (radial acquisition). Further, the sequence control circuitry 120 executes a second pulse sequence a plurality of times by changing a frequency of magnetization transfer (MT) pulses, the second pulse sequence acquiring data by Cartesian sampling (Cartesian acquisition) after applying an MT pulse.

Figure 2:
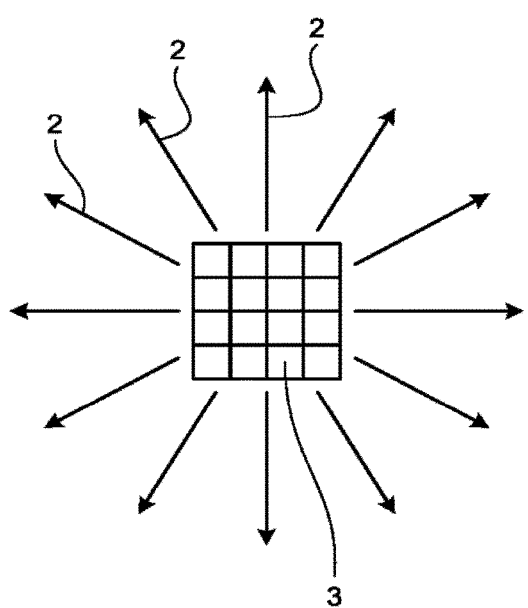
FIG. 2 and FIG. 3 are drawings illustrating data acquisition according to a first embodiment.
Figure 3:
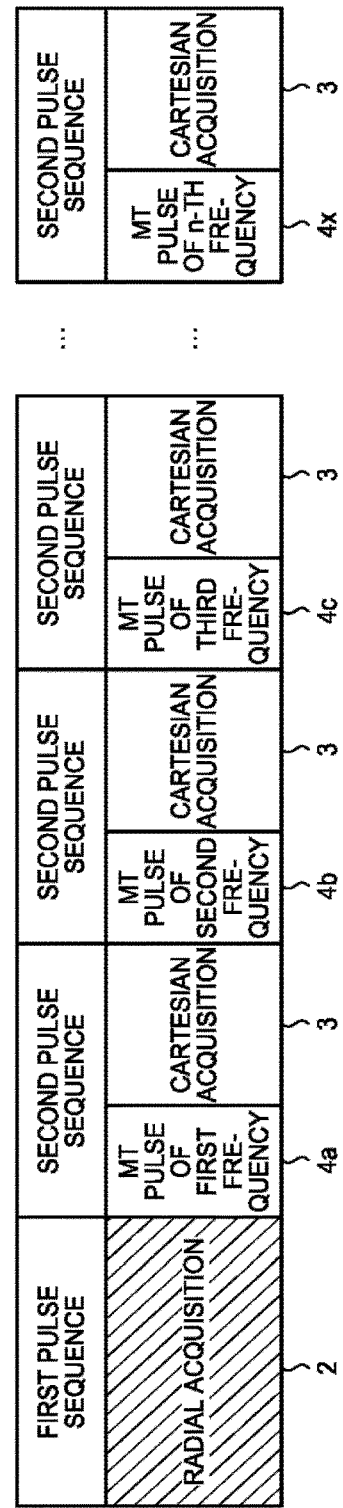

Details of such processing will be explained with reference to FIG. 2 to FIG. 6. FIG. 2 and FIG. 3 are drawings illustrating data acquisition according to a first embodiment.

FIG. 2 schematically illustrates the k-space in which data is acquired. In FIG. 2, for the sake of simplicity of the explanation, two-dimensional k-space is shown, in which left-right direction indicates k$_x$ and up-down direction indicates k$_y$. The central part in FIG. 2 represents the central part of the k-space. Further, in FIG. 2, each of the arrows extending outward indicates radial acquisition 2 (data acquisition by radial acquisition). Further, in FIG. 2, Cartesian acquisition 3 indicates data acquisition by Cartesian acquisition being conducted in the central part of k-space.

FIG. 3 is a timing chart illustrating the detail of a pulse sequence according to the first embodiment. The horizontal axis represents time. Further, FIG. 4 is a flowchart illustrating a procedure of a processing executed by a magnetic resonance imaging apparatus according to the first embodiment.

Figure 4:
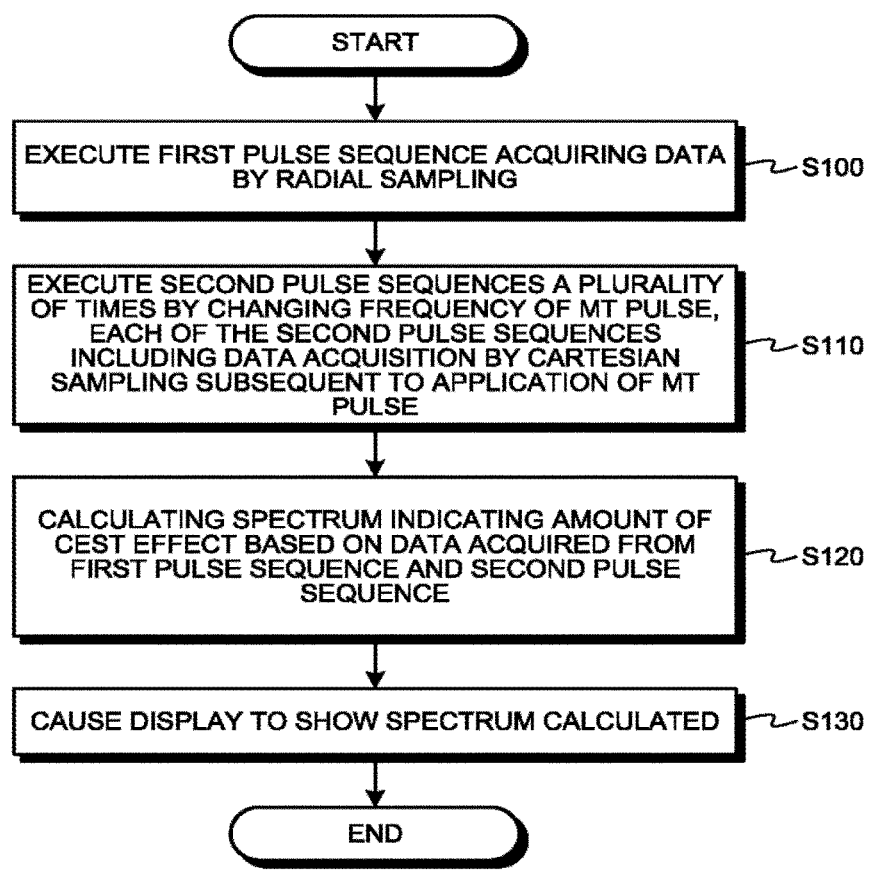
FIG. 4 is a flowchart illustrating a procedure of a processing executed by a magnetic resonance imaging apparatus according to the first embodiment.

First of all, in FIG. 4, the sequence control circuitry 120 acquires data by radial sampling. In other words, the sequence control circuitry 120 executes a first pulse sequence performing radial acquisition 2 (Step S100). The sequence control circuitry 120 repeatedly performs, for example, as illustrated in FIG. 2, the radial acquisition 2 starting from the central part of the k-space and extending to the outer part of the k-space, by gradually changing the orientation of acquisition.

It is noted that, in FIG. 2, in order to simply illustrate the difference between the radial acquisition 2 and the Cartesian acquisition 3, a case of two-dimensional k-space is explained. However, for practical purposes, the radial acquisition 2 and the Cartesian acquisition 3 are usually performed in three-dimensional k-space. In that situation, data is acquired in three directions, including k$_x$ direction, k$_y$ direction and k$_z$ direction. Further, the Cartesian acquisition 3 is performed in the central part of the three-dimensional k-space. Further, the radial acquisition 2 is repeatedly performed, starting from the central part of the three-dimensional k-space and extending to the outer part.

When performing the radial acquisition 2, the sequence control circuitry 120 starts the sampling from the central part of the k-space. With the sequence control circuitry 120 starting the sampling from the central part of the k-space and performing the radial acquisition 2, shortening of the echo time (TE) becomes possible. Thus, the sequence control circuitry 120 can acquire data of the whole k-space in a short time. In this way, the sequence control circuitry 120 executes a first pulse sequence using radial sampling. The sequence control circuitry 120 employs, for example, as the first pulse sequence, an ultrashort echo time (UTE) sequence. An exemplary timing in which the radial acquisition 2 is performed is illustrated in FIG. 3. The sequence control circuitry 120 performs, for example, the first pulse sequence 1 by the radial acquisition 2, prior to the execution of the second pulse sequence.

It is noted that, the first pulse sequence according to the embodiment is advantageous to other pulse sequences in the following points. Contrary to the fact that EPI (Echo Planar Imaging) and GRASE (Gradient and Spin Echo) are vulnerable to B$_0$ inhomogeneity, the pulse sequences according to the embodiments are stable against the B$_0$ inhomogeneity. Further, by FSE (Fast Spin Echo), FAST (Fast Advanced Spin Echo), SSFSE (Single Shot Fast Spin Echo), EPI or the like, which are commonly used pulse sequences, it is difficult to depict ultrashort T$_2$ components, such as bones, cartilage and ligaments. By the pulse sequences according to the embodiments, these ultrashort components can be sufficiently depicted. Further, as for the pulse sequences according to the embodiments, specific absorption rate (SAR) is smaller compared to FSE and the like, which is an advantage. Further, as the pulse sequences according to the embodiments employ quiet sequences for the radial sampling, acoustic noise is small and a silent pulse sequence can be realized.

Next, the sequence control circuitry 120 executes second pulse sequences a plurality of times by changing a frequency (a CEST (Chemical Exchange Saturation Transfer) frequency) of magnetization transfer (MT) pulses, each of the second pulse sequences acquiring data by Cartesian sampling after applying an MT pulse (Step S110).

Specifically, the sequence control circuitry 120 applies, after performing the radial data acquisition 2 in the first pulse sequence, an MT pulse 4a of a first frequency as illustrated in FIG. 3.

Here, an MT pulse is an RE pulse of a frequency other than the frequency corresponding to the resonance frequency of free-water protons. Thus, by an application of the MT pulse, protons other than the free-water protons become saturated. Here, as there exists a chemical exchange between the protons other than the free-water protons and the free-water protons, magnetization of the protons that are other than the free-water protons transfers to the free-water protons as time goes by. When imaging is performed by applying an RF pulse of a frequency corresponding to the resonance frequency of the free-water protons, the protons other than the free-water protons, having been excited by the MT pulse, can be imaged indirectly. This effect is what is dubbed as the MT effect (the CEST effect).

Protons conspicuously showing the MT effect (the CEST effect) includes, for example, hydroxyl group (—OH) protons, amino group (—NH$_2$) protons, amide group (—NH) protons and the like. Therefore, by applying an MT pulse including the frequency corresponding to the resonance frequency of protons of at least one of the groups, the processing circuitry 150 can depict the CEST effect corresponding to these protons. Specifically, the resonance frequency of hydroxyl group protons is +1 ppm relative to the resonance frequency of the free-water protons. The resonance frequency of amino group protons is +2 ppm relative to the resonance frequency of the free-water protons. The resonance frequency of amide group protons is +3.5 ppm relative to the resonance frequency of the free-water protons. Therefore, the sequence control circuitry 120 applies, for example, MT pulses a plurality of times, by changing a frequency by 0.5 ppm for each time, for example, in a frequency range −5.0 ppm to +5.0 ppm, relative to the resonance frequency of the free-water protons. As for FIG. 3, after performing the radial acquisition 2 in the first pulse sequence, the sequence control circuitry 120 applies, for example, the MT pulse 4a of a frequency of −5.0 ppm in the second pulse sequence.

It is noted that since the MT effect (the CEST effect) is relatively small by itself, in order to augment the MT effects, a plurality of MT pulses per frequency is often consecutively applied. To put it in another way, the sequence control circuitry 120 applies, for example, a plurality of times of the MT pulses 4a of the frequency of −5.0 ppm, prior to the Cartesian acquisition 3.

Subsequently, the sequence control circuitry 120 performs the Cartesian acquisition 3 in the vicinity of the central part of the k-space as illustrated in FIG. 2. The sequence control circuitry 120 performs the Cartesian acquisition 3 in the vicinity of the central part of the k-space, for example, by using various pulse sequences that conduct a single-point imaging (SPI). The pulse sequences used for the Cartesian acquisition 3 include, for example, a similar sequence as used in the Cartesian acquisition of PETRA (Pointwise Encoding Time Reduction with Radial Acquisition).

The reason why the sequence control circuitry performs the Cartesian acquisition 3 is the following: The sequence control circuitry 120 does perform acquisition in the vicinity of the k-space by the radial acquisition 2 in the first pulse sequence, but that alone is not sufficient in terms of data precision in the vicinity of the central part of the k-space in some cases. Thus the sequence control circuitry 120 acquires data in the vicinity of the central part of the k-space, again by the Cartesian acquisition 3.

Further, in the Cartesian acquisition 3, as the k-space acquired is smaller, acquisition time required becomes shorter compared to the radial acquisition 2 in which acquisition is performed in the larger part of the k-space. The sequence control circuitry 120 applies MT pulses, in pulse sequences including the Cartesian acquisition 3 whose acquisition time is short, prior to the data acquisition, thereby capable of conducting the CEST imaging.

To put it in another way, in other to calculate spectra representing the amount of the CEST effect such as Z spectra, both the k-space data by the radial sampling and the data in the vicinity of the central part of the k-space by the Cartesian sampling are used. However, the sequence control circuitry 120 applies MT pulses only in the Cartesian sampling in the vicinity of the central part of the k-space where data that is particularly important is concentrated out of the whole k-space data. With this method being employed, the number of radial sampling can be reduced to one, thus the total imaging time can be shortened. On the other hand, as for the vicinity of the central part of the k-space, the second pulse sequences are executed a plurality of times by changing the frequency of the MT pulses, thus the CEST effect can be reflected to the image to a satisfying degree. In this way, both the reduction of imaging time and the depiction of the CEST effect can be realized while striking a good balance between them.

Returning to FIG. 3, the sequence control circuitry 120 applies, in the second pulse sequence, an MT pulse 4b of a second frequency that is different from the first frequency. Subsequently, the sequence control circuitry 120 performs the Cartesian acquisition 3 again in the vicinity of the central part of the k-space. The sequence control circuitry 120 performs, for example, the MT pulse 4b of a frequency of −4.5 ppm and subsequently performs the Cartesian acquisition 3 again in the vicinity of the central part of the k-space. At this time, the Cartesian acquisition 3 subsequent to the MT pulse 4a and the Cartesian acquisition 3 subsequent to the MT pulse 4b are, for example, acquired with respect to the same k-space position.

Next, the sequence control circuitry 120 applies, in the second pulse sequence, an MT pulse 4c of a third frequency that is different from the first frequency and the second frequency. Subsequently, the sequence control circuitry 120 performs the Cartesian acquisition again in the vicinity of the central part of the k-space. The sequence control circuitry 120 applies, for example, the MT pulse 4c of a frequency of −4.0 ppm and subsequently performs the Cartesian acquisition 3 again in the vicinity of the central part of the k-space. At this time, the Cartesian acquisition 3 performed subsequent to the MT pulse 4c and the Cartesian acquisition 3 earlier than the Cartesian acquisition 3 performed subsequent to the MT pulse 4c is acquired with respect to the same k-space position.

In this way, the sequence control circuitry 120 repeatedly executes the second pulse sequences. The sequence control circuitry 120 repeatedly executes the second pulse sequences until the sequence control circuitry 120 applies an MT pulse 4x of a frequency of +5.0 ppm and finishes the Cartesian acquisition 3 in the vicinity of the central part of the k-space.

Returning to FIG. 4, the processing circuitry 150 calculates, by an image generation function 136, a spectrum indicating the amount of the CEST effect based on data acquired from the first pulse sequence and the second pulse sequence (Step S120). Here, the spectrum indicating the amount of the CEST effect is, for example, the Z spectrum or the Magnetization Transfer Ratio Asymmetry (MTRasym) spectrum.

Here, the Z spectrum is a spectrum indicating the signal intensity when applying an RF pulse corresponding to the resonance frequency of the free-water protons after the application of an MT pulse, as a function of the frequency of the MT pulse applied.

The Z spectrum is briefly explained. If the CEST effect does not exist, only the effect of saturation of free-water protons is reflected on the Z spectrum. As a result, the Z spectrum becomes a symmetrical spectrum with respect to the resonance frequency of the free-water protons that is chosen as the origin. On the other hand, if the CEST effect exists, the Z spectrum becomes a non-symmetrical spectrum with respect to the resonance frequency of the free-water protons that is chosen as the origin.

For example, when the frequency of the MT pulse applied by the sequence control circuitry 120 is +3.5 ppm, amide group protons become saturated due to the MT pulse and become chemically-exchanged with the free-water protons. As a result, signal values decrease. On the other hand, when the frequency of the MT pulse applied by the sequence control circuitry 120 is −3.5 ppm, No protons that are chemically-exchanged with the free-water protons exist at −3.5 ppm. As a result, signal values do not decrease.

Figure 5:
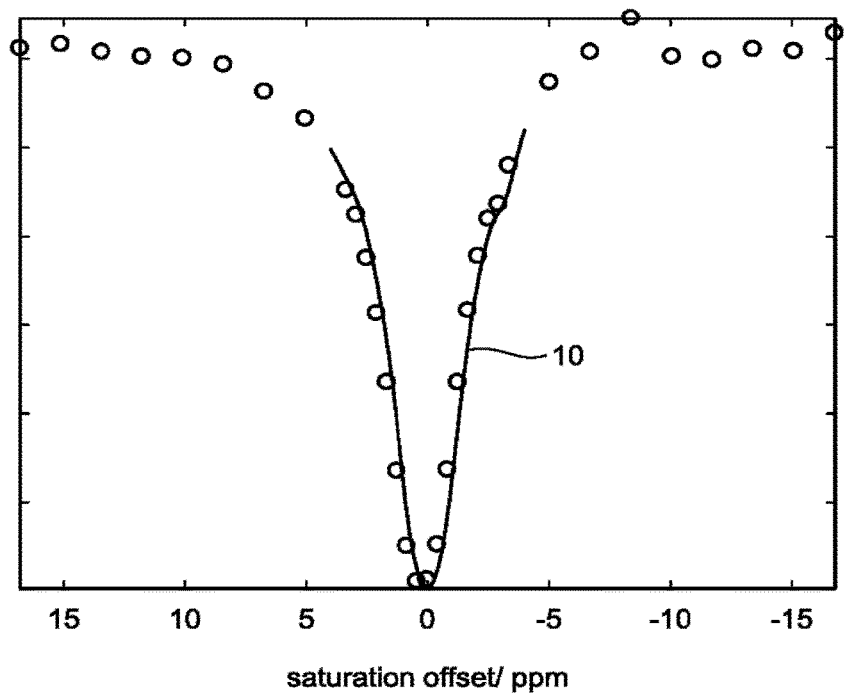
FIG. 5 is an example of a Z-spectrum.

In other words, a quantity representing the asymmetry of the Z spectrum becomes a quantity representing the amount of the CEST effect. In FIG. 5, an example of the Z spectrum is shown. In FIG. 5, the vertical axis indicates signal intensity and the horizontal axis indicates the frequency of the MT pulse applied. The frequency of the MR pulse applied is shown in the unit of ppm by the relative value with the resonance frequency of the free-water protons being zero. The open circles indicate data points. A Z spectrum 10 indicates the Z spectrum constructed from these data points. The asymmetry of the Z spectrum 10 illustrated in FIG. 5 becomes a quantity indicating the amount of the CEST effect.

The MTRasym spectrum is a spectrum indicating the asymmetry of the Z spectrum. For example, let S be the signal intensity when applying an MT pulse of a frequency of −x ppm. Let $S_+$ be the signal intensity when applying an MT pulse of a frequency of +x ppm that is the position symmetrical to −x ppm. Let $S_0$ be the signal intensity when no MT pulse is applied. The MTRasym spectrum at the frequency of x ppm can be calculated as $(S_+ - S_-)/S_0$.

Next, calculation methods of a spectrum indicating the amount of the CEST effect is explained. The processing circuitry 150 generates, by the image generation function 136, a spectrum that is similar to the Z spectrum and that corresponds to the first frequency, based on, for example, data acquired from the radial acquisition 2 and data acquired from the Cartesian acquisition 3 subsequent to the MT pulse 4a of the first frequency. The processing circuitry 150 generates, by the image generation function 136, a spectrum that is similar to the Z spectrum and that corresponds to the second frequency, based on, for example, data acquired from the radial acquisition 2 and data acquired from the Cartesian acquisition 3 subsequent to the MT pulse 4b of the second frequency. Similarly, the processing circuitry 150 generates, by the image generation function 136, a spectrum that is similar to the Z spectrum and that corresponds to the third frequency, based on, for example, data acquired from the radial acquisition 2 and data acquired from the Cartesian acquisition 3 subsequent to the MT pulse 4c of the third frequency.

A brief explanation is given as to what is meant by "a spectrum that is similar to the Z spectrum". At the first frequency, by the image generation function 136, for an area in the central part of the k-space, the processing circuitry 150 generates the Z spectrum using data acquired from the Cartesian acquisition 3 in which an MT pulse is applied. On the other hand, for an area other than the area in the central part of the k-space, the processing circuitry 150 generates the Z spectrum using data acquired from the radial acquisition 2 in which no MT pulse is applied. Therefore, for the area other than the area in the central part of the k-space, the CEST effect is not reflected on the spectrum. However, the spectrum is generated based on data in which an MT pulse is applied, for the area in the central part of the k-space in which important information is included. For this reason, the spectrum obtained in this way can be considered as a spectrum on which the CEST effect is reflected, just like the Z spectrum. In other words, the spectrum generated by the processing circuitry 150 is a spectrum capable of being generated within a short imaging time, while it is also a spectrum on which the CEST effect is duly reflected.

The processing circuitry 150 generates, in the similar manner, a spectrum similar to the MTRasym spectrum, based on the spectrum thus generated. In the following, for the sake of convenience, "a spectrum similar to the Z spectrum" and "a spectrum similar to the MTRasym spectrum" are referred to as "the Z spectrum" and "the MTRasym spectrum", respectively. In this way, the processing circuitry 150 calculates a spectrum indicating the amount of the CEST effect.

It is noted that, at Step S120, the region in which the Z spectrum and/or the MTRasym spectrum is calculated may be the whole imaging region or a designated region of interest (ROI). In other words, at Step S120, the processing circuitry 150 may generate the Z spectrum and the MTRasym spectrum by integrating over the whole imaging region or may generate the Z spectrum and the MTRasym spectrum by integrating over the designated ROI. Alternatively, the processing circuitry 150 may generate the Z spectrum and the MTRasym spectrum for a single pixel of a hydrogen image.

Figure 6:
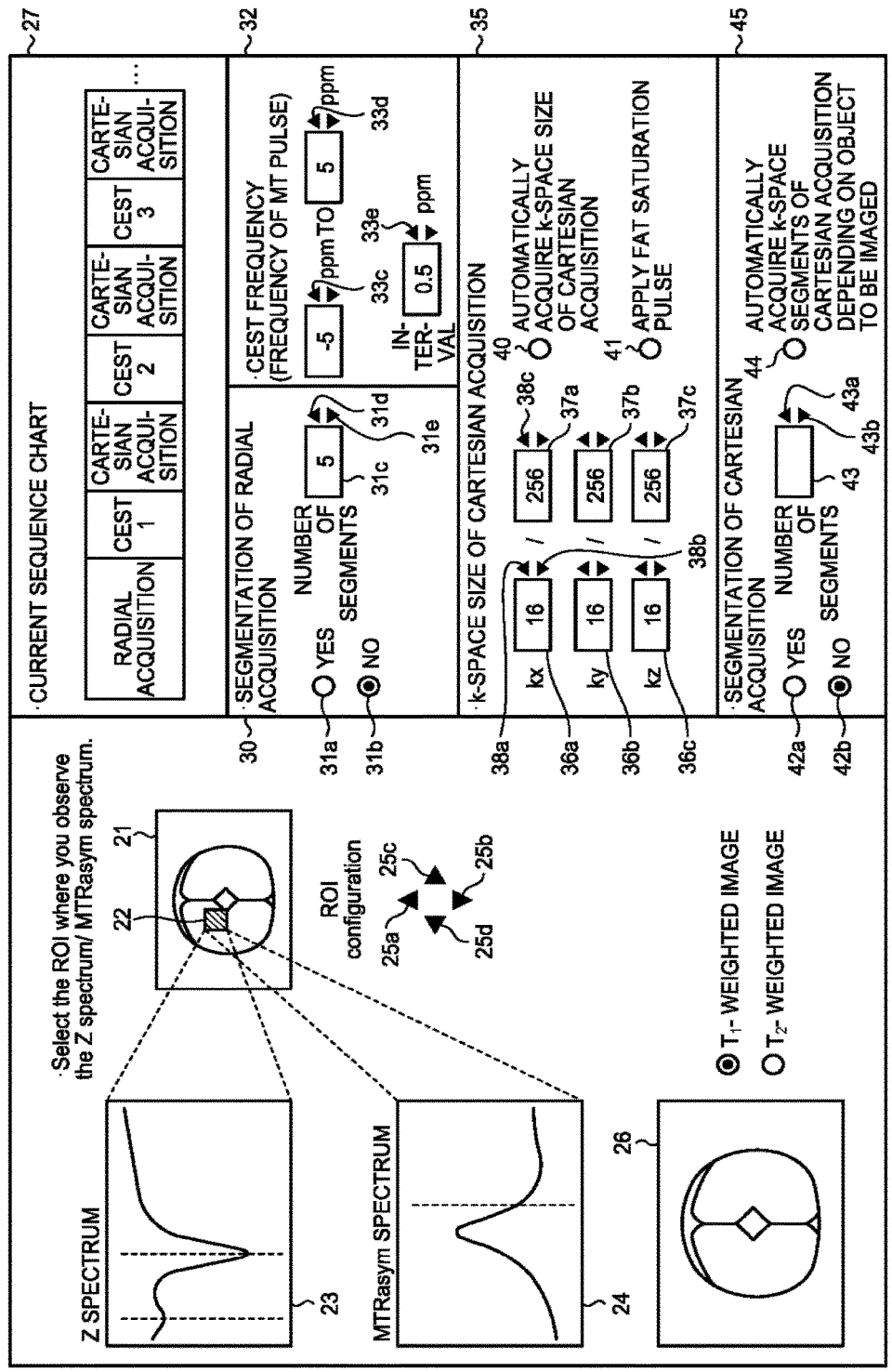
FIG. 6 is an example of a Graphical User Interface (GUI) according to a magnetic resonance imaging apparatus according to the first embodiment.

As for the designation of ROI, an example of a GUI is illustrated in FIG. 6. FIG. 6 is an example of a GUI according to a magnetic resonance imaging apparatus according to the first embodiment. A panel 21 is a panel for the configuration of an ROI for generating the Z spectrum and the MTRasym spectrum. Buttons 25a, 25b, 25c and 25d are buttons for the configuration of the ROI.

When a user clicks the button 25a, 25b, 25d or 25c by the time Step S120 is started, an ROI 22 that is the ROI for generating the Z spectrum or the MTRasym spectrum generated at Step S120, will move up, move down, move to the right or move to the left, respectively. In this way, the processing circuitry 150 accepts an input of a selection of the ROI 22 from the user. At Step S120, the processing circuitry 150 calculates a spectrum indicating the amount of the CEST effect, based on the input of the ROI22 accepted by the user. In other words, when the processing circuitry 150 calculates the spectrum indicating the amount of the CEST effect at Step S120, the processing circuitry 150 calculates the spectrum, selecting the ROI 22 as the integration region.

Returning to FIG. 4, by the control function 133, the processing circuitry 150 causes the display 135 to show the spectrum calculated at Step S120 (Step S130). An example of such GUI is illustrated in FIG. 6.

In FIG. 6, a display area 23 indicates an area in which the processing circuitry 150 causes the display 135 to show the Z spectrum. A display area 24 indicates an area in which the processing circuitry 150 causes the display 135 to show the MTRasym spectrum. The processing circuitry 150 causes the display 135 to show, in the display area 23, the Z spectrum corresponding to the ROI 22 that is selected by the time Step S120 is started. Further, the processing circuitry 150 causes the display 135 to chow, in the display area 24, the MTRasym spectrum corresponding the ROI 22 that is selected by the time Step S120 is started.

When a user having seen the Z spectrum shown in the display area 23 or the MTRasym spectrum shown in the display area 24 wishes to change the ROI 22, the processing circuitry 150 accepts, by the control function 133, an input of a change of the ROI 22 by the button 25a, 25b, 25c, 25d and the like. In such a case, the process returns to Step S120. By the image generation function 136, the processing circuitry 150 calculates the spectrum indicating the amount of the CEST effect, based on the ROI 22 after the change.

It is noted that, as illustrated in FIG. 6, the processing circuitry 150 causes the display 135 to show, for example, by a display area 26, a normal image such as a $T_1$-weighted image.

Further, the processing circuitry 150 causes the display 135 to show, for example by a display area 27, the sequence chart of the pulse sequence currently being executed or pulse sequences that have been executed.

Further, the processing circuitry 150 may accept, as shown in a panel 32, from a user, an input of configuration of the MT pulse frequency (CEST frequency) applied in the second pulse sequence. Specifically, when a user clicks on buttons 33c, 33d and 33e by the time Step S110 is started, the processing circuitry 150 accepts an input of a change of the lower limit value or the upper limit value of the frequency or the frequency interval of the MT pulse applied in the second pulse sequence. The sequence control circuitry 120 applies the second pulse sequence by changing the frequency of the MT pulse at Step S110, based on the lower limit value or the upper limit value of the frequency or the frequency interval of the MT pulse accepted by the processing circuitry 150.

It is noted that a panel 30, a panel 35 and a panel 45 will be explained in detail in the embodiments to be described later.

It is noted that embodiments are not limited to the above-described example.

In the embodiment, a case is explained in which the sequence control circuitry 120 performs three-dimensional radial sampling at Step S100. However, embodiments are not limited to this example. For example, the sequence control circuitry 120 may perform two-dimensional radial sampling at Step S100. In other words, sequence control circuitry 120 may perform two-dimensional PETRA sequence. Alternatively, the sequence control circuitry 120 may perform two-dimensional stack-of-stars sampling at Step S100. Alternatively, the sequence control circuitry 120 may perform two-dimensional multi-slice acquisition at Step S100.

Further, the sequence control circuitry 120 may perform the radial acquisition 2 in the first pulse sequence by using golden-angle sampling pattern at Step S100.

At Step S120, a case is explained in which, when a target area in which the spectrum indicating the amount of the CEST effect is calculated is the designated ROI and the configuration timing of the ROI 22 is after the execution of the pulse sequence. However, embodiments are not limited to this. The processing circuitry 150 may accept an input of the ROI 22 of the target to be imaged prior to the execution of the first pulse sequence and the second pulse sequence and the processing circuitry 150 may execute the first pulse sequence and the second pulse sequence based on the accepted result.

Further, it has been explained that the sequence control circuitry 120 performs the radial acquisition 2 in the first pulse sequence at Step S100 and thereafter performs the Cartesian acquisition in the second pulse sequence at Step S110. However, embodiments are not limited to this example. For example, the sequence control 120 may perform the radial acquisition 2 in the first pulse sequence after the sequence control sequence circuitry 120 performs Cartesian data acquisition 3 in the second pulse sequence in the beginning. Further, the sequence control circuitry 120 may execute the second pulse sequence several times in the beginning, thereafter execute a first pulse sequence and subsequently execute the second pulse sequence several times.

Further, a case has been explained in which at Step S120, the processing circuitry 150 calculates the spectrum indicating the amount of the CEST effect based on both the data of the first pulse sequence and the second pulse sequence. However, embodiments are not limited to this example. The processing circuitry 150 may calculate a spectrum indicating the amount of the CEST effect based on the second pulse sequence alone, in other words, the Cartesian acquisition 3 alone.

Further, in the plurality of second pulse sequences, a case has been explained in which the k-space positions of the Cartesian acquisitions 3 are the same. However, embodiments are not limited to this example. In other words, in the plurality of second pulse sequences, k-space positions of the Cartesian acquisition 3 may be mutually different.

Further, the second pulse sequence need not be executed a plurality of times. The second pulse sequence may be executed just once. In that case, the frequency of the MT pulse applied by the second pulse sequence may be set to a certain frequency, such as the resonance frequency of the hydroxyl group protons that is +1 ppm, the resonance frequency of the amino group protons that is +2 ppm, the resonance frequency of the amide group protons that is +3.5 ppm, and the like.

As described above, according to the magnetic resonance imaging apparatus 100 according to the first embodiment, the CEST imaging can be performed in a short imaging time.

Second Embodiment

In the second embodiment, a case will be explained in which the sequence control circuitry 120 further applies a fat saturation pulse in the second pulse sequence. By this construction, an image in which fat signals are removed can be obtained.

Figure 7:
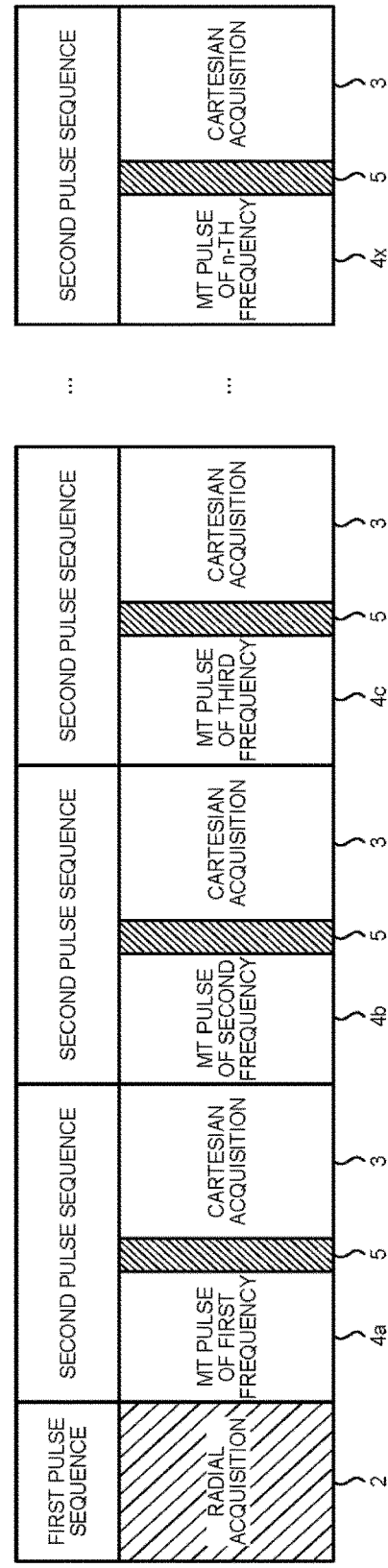
FIG. 7 is a drawing illustrating an example of data acquisition according to a second embodiment.

An example of this construction is illustrated in FIG. 7. FIG. 7 is a diagram illustrating data acquisition in the second embodiment.

In FIG. 7, radial acquisition 2 indicates, in the similar manner as in the first embodiment, radial acquisition that is acquisition executed in the first pulse sequence. Each of an MT pulse 4a, an MT pulse 4b, an MT pulse 4c and an MT pulse 4x indicates an MT pulse of a first frequency, a second frequency, a third frequency and a n-th frequency, respectively, that is applied in the second pulse sequence. Cartesian acquisition 3 indicates Cartesian acquisition executed in the second pulse sequence. A fat saturation pulse 5 indicates a pulse applied to remove fat signals in the Cartesian acquisition 3.

With reference to FIG. 4 again, in the beginning, the sequence control circuitry 120 executes the first pulse sequence executing data acquisition by the radial acquisition 2 as illustrated in FIG. 7, in the similar manner as in the first embodiment (Step S100). Subsequently, the sequence control circuitry 120 executes the second pulse sequence a plurality of times by changing the frequency of the MT pulse, the second pulse sequence acquiring data by Cartesian sampling subsequent to the application of the MT pulse (Step S110). Specifically, as illustrated in FIG. 7, after the sequence control circuitry 12 applies the MT pulse 4a of the first frequency, the sequence control circuitry 120 applies the fat saturation pulse 5 and performs the Cartesian acquisition 3. Since the fat saturation pulse 5 is applied, the data acquired by the Cartesian acquisition 3 becomes a signal in which fat signals are removed. Next, after the sequence control circuitry 120 applies the MT pulse 4b of the second frequency, the sequence control circuitry 120 applies the fat saturation pulse 5, and subsequently performing the Cartesian acquisition. Next, after the sequence control circuitry 120 applies the MT pulse 4c of the third frequency, the sequence control circuitry 120 applies the fat saturation pulse 5 and performs the Cartesian acquisition. In this way, the sequence control circuitry 120 repeats acquisition, by changing the frequency of the MT pulses and by applying fat saturation pulses 5, until the Cartesian acquisition 3 corresponding to the MT pulse 4x of the n-th frequency is completed.

As for Step S120 and Step S130, processing similar to that of the first embodiment is performed.

It is noted that when the processing circuitry 150 accepts from a user an input of whether or not to apply the fat saturation pulse 5 and accepts from the user an input requesting that the fat saturation pulse 5 be applied, the sequence control circuitry 120 may apply the fat saturation pulse 5. An example of such GUI is illustrated in FIG. 6. In FIG. 6, when the user clicks a button 41, the sequence control circuitry 120 executes the pulse sequence of FIG. 7, including the fat saturation pulse 5.

As described above, in the second embodiment, fat saturation pulses are further applied. By this method, an image in which fat signals are removed can be obtained.

Third Embodiment

In the third embodiment, a case is explained in which an optimization of the pulse sequence described in the first embodiment is performed depending on the target to be imaged or a purpose of the imaging. Specifically, in the third embodiment, a case is explained in which the size of the k-space in which Cartesian acquisition is performed is adjusted depending on the target to be imaged or the purpose of the imaging. In other words, in the third embodiment, the ratio of the k-space in which Cartesian acquisition is performed to the k-space in which radial acquisition is performed is adjusted depending on the target to be imaged or the purpose of the imaging.

Figure 8:
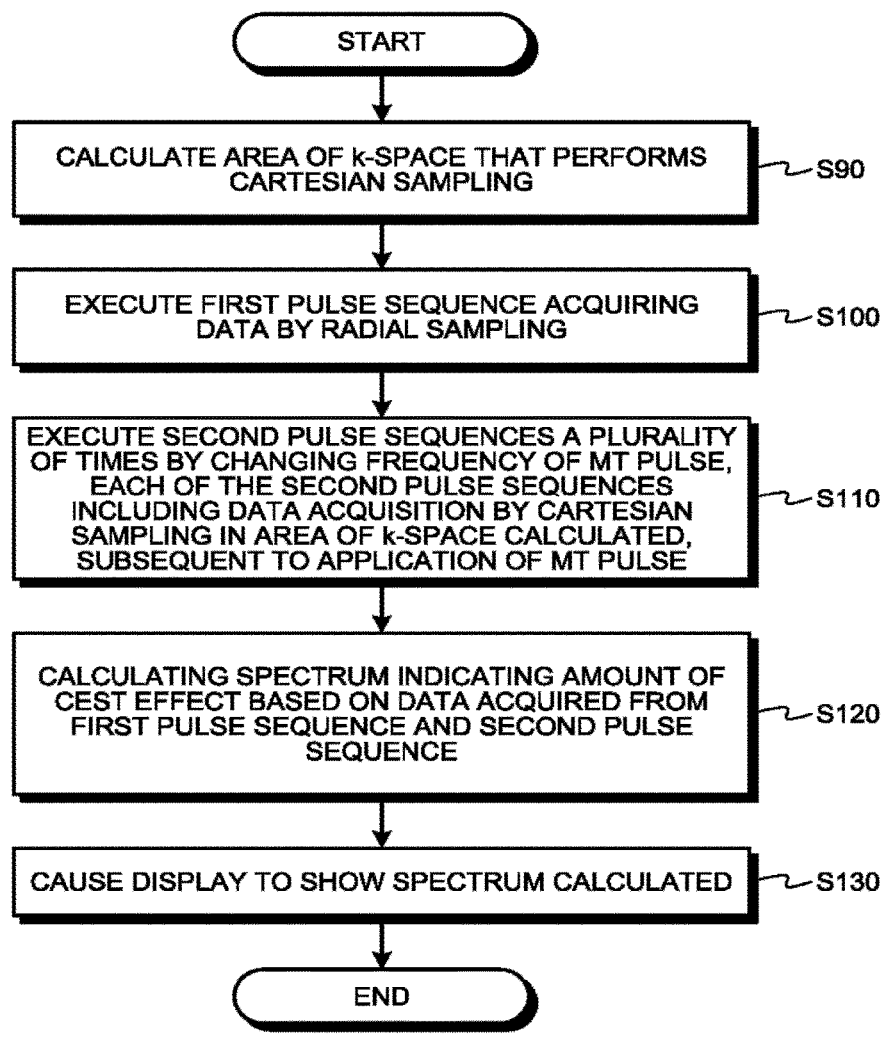
FIG. 8 is a flowchart illustrating a procedure of a processing executed by a magnetic resonance imaging apparatus according to a third embodiment.

FIG. 8 is a flowchart illustrating a procedure of processing performed by a magnetic resonance imaging apparatus according to the third embodiment. The pulse sequence executed in the third embodiment is similar to that of the first embodiment. As for Step S100, Step S120 and Step S130 of FIG. 8, processing similar to FIG. 4 is performed. Explanations of these steps will not be repeated.

At Step S90, by the control function 133, the processing circuitry 150 calculates the area of the k-space in which data acquisition is performed by Cartesian sampling in the second pulse sequence at Step S110, based on information such as a target to be imaged, an image quality required, imaging time and the like.

For example, if the area of the k-space in which data acquisition is to be performed by Cartesian sampling becomes large, the image quality of the spectrum indicating the CEST effect is improved. On the other hand, if the area of the k-space in which data acquisition is performed by Cartesian sampling becomes large, the imaging time becomes long. Thus, by the control function 133, the processing circuitry 150 calculates the area of the k-space in which data acquisition is performed by Cartesian sampling, taking into consideration the balance between the image quality of the CEST spectrum obtained and the imaging time required.

For example, if the processing circuitry 150 has already accepted the input of the value of the imaging time from a user by the input circuitry 134, the processing circuitry 150 calculates, based on the result of the input, an area of the k-space for which the imaging time does not exceed the value that is input, as the area of the k-space being a k-space in which the data acquisition is performed by the Cartesian sampling. Further, if the processing circuitry 150 has already accepted, from a user and by the input circuitry 134, an input of information regarding to what extent of image quality is required, the processing circuitry 150 calculates, based on the result that is input, an area of the k-space in which the image quality of the spectrum that is a finalized output and that indicates the CEST effect, exceeds a standard value that is input, as the area of the k-space in which data acquisition is performed by Cartesian sampling.

Alternatively, the storage circuitry 132 stores a table in which a body part of the imaging and a default value optimal for imaging the body part of the imaging are associated, the default value pertaining to the area of the k-space in which the data acquisition is performed by the Cartesian sampling. When the processing circuitry 150 accepts, from a user and by the input circuitry 134, an input of the body part of the imaging, by the control function 133, the processing circuitry 150 reads the table from the storage circuitry 132 and calculates the default value for the body part of the imaging and of the area of the k-space in which data acquisition is performed by Cartesian sampling, as the area of the k-space in which data acquisition is performed by Cartesian sampling.

In FIG. 6, an example of such GUI is illustrated. In FIG. 6, when a user clicks a button 40, the sequence control circuitry 120 calculates the area of the k-space in which data acquisition is performed by Cartesian sampling at Step S90.

Alternatively, the processing circuitry 150 directly accepts, by input circuitry 134, an input of the area of the k-space in which data acquisition is performed by Cartesian sampling. FIG. 6 illustrates an example of such GUI. In FIG. 6, each of a display area 37a, a display area 37b and a display area 37c indicates the number of data points in the whole k-space in x direction, in y direction and in z direction, respectively. Each of a display area 36a, a display area 36b and a display area 36c indicates the number of data points in the k-space in x direction, in y direction and in z direction, respectively, in which the Cartesian acquisition 3 is performed. When a user clicks a button 38a or a button 38b, the processing circuitry 150 accepts an input of change of the number of the data points in the k-space in x direction in which the Cartesian acquisition 3 is performed. It is noted that when a user clicks a button 38c, the processing circuitry 150 may accept an input of change of the number of data points in the whole k-space in x direction.

The sequence control circuitry 120 executes the processing similar to that of the first embodiment at Step S100.

The processing circuitry 150 executes, at Step S110, the second pulse sequence a plurality of times by changing the frequency of the MT pulse, the second pulse sequence acquiring data by the Cartesian sampling in an area of the k-space calculated at Step S90 after applying the MT pulse (Step S110).

The sequence control circuitry 120 performs, at Step S120 and Step S130, the similar processing as that in the first embodiment.

In the third embodiment, the size of the k-space in which the Cartesian acquisition is performed is adjusted depending on the target of the imaging or the purpose of the imaging. By this method, image quality of the CEST spectrum can be maintained while shortening the imaging time.

Fourth Embodiment

In the fourth embodiment, an example is explained in which the radial acquisition 2 is split into a plurality of times of acquisition and thus executed, thereby performing an optimization of the pulse sequence described in the first embodiment. In other words, in the fourth embodiment, the sequence control circuitry 120 splits the first pulse sequence into a plurality of times of acquisition, thereby executing the first pulse sequence.

In the fourth embodiment, the reason the radial acquisition 2 is split into a plurality of times of acquisition and then executed is the following:

As for the first reason, by splitting the radial acquisition 2 into a plurality of times of acquisition, the area of the k-space that has to be acquired in one time can be made to be small. Thus, the degree of freedom in designing the first pulse sequence executing the radial acquisition 2 increases. For example, as for imaging of the body part where $T_1$ is small, such as bones, it becomes necessary to make TE (Echo Time) small. However, by splitting the radial acquisition 2 into a plurality of times of acquisition, it becomes possible to increase the number of choices as to the pulse sequence to be employed.

As for the second reason, by sandwiching the radial acquisition 2 between the second pulse sequences, an MT pulse application interval of different frequencies can be increased. By this method, it is possible to avoid interferences between MT pulses of different frequencies. In other words, the effect that originates from the influence of the MT pulses of different frequencies contaminating the signal of data acquisition can be mitigated.

An example of the pulse sequence applied by the fourth embodiments is illustrated in FIG. 9. FIG. 9 is an example illustrating data acquisition of the fourth embodiment.

In FIG. 9, a radial acquisition 2a, a radial acquisition 2b, a radial acquisition 2b, a radial acquisition 2c and a radial acquisition 2x indicate, similarly to the first embodiment, radial acquisition executed in the first pulse sequence. Each of the radial acquisition 2a, the radial acquisition 2b, the radial acquisition 2c and the radial acquisition 2x is radial acquisition of the first segment, the second segment, the third segment and the n-th segment, respectively. Each of the radial acquisition 2a, the radial acquisition 2b and the radial acquisition 2c corresponds to acquisition of the area of the k-space illustrated in the drawing at the bottom of FIG. 9.

Each of an MT pulse 4a, an MT pulse 4b, an MT pulse 4c and an MT pulse 4x indicates an MT pulse of a first frequency, a second frequency, a third frequency and a n-th frequency. Cartesian acquisition 3 indicates Cartesian acquisition executed in the second pulse sequence.

In the fourth embodiment, as for Step S120 and Step S130 of FIG. 4, the similar processing as the first embodiment is performed. In processing corresponding to Step S100 and Step S110 of FIG. 4, the sequence control circuitry 120 executes a pulse sequence incorporating the first pulse sequence into the second pulse sequence.

Specifically, as illustrated in FIG. 9, the sequence control circuitry 120 executes a first pulse sequence performing data acquisition by the radial acquisition 2a of the first segment. Subsequently, after the sequence control 120 applies the MT pulse 4a of the first frequency, the sequence control circuitry 120 performs the Cartesian acquisition 3. Subsequently, the sequence control circuitry 120 executes a first pulse sequence performing data acquisition by the radial acquisition 2b of the second segment. Subsequently, after the sequence control circuitry 120 applies the MT pulse 4b of the second frequency, the sequence control circuitry 120 performs the Cartesian acquisition 3. Subsequently, the sequence control circuitry 120 executes a first pulse sequence performing data acquisition by the radial acquisition 2c of the third segment. Subsequently, after the sequence control circuitry 120 applies the MT pulse 4c of the third frequency, the sequence control circuitry 120 performs the Cartesian acquisition 3. In this way, the sequence control circuitry 120 executes the first pulse sequence a plurality of times, incorporating the first pulse sequences into the second pulse sequences.

An example of a GUI according to the fourth embodiment is illustrated in the panel 30 of FIG. 6. By a button 31a or a button 31b, a user can choose whether or not to perform segmentation of the radial acquisition. For example, when the user selects a button 31, the processing circuitry 150 executes the first pulse sequence and the second pulse sequence, by performing the segmentation of the radial acquisition. Further, in a display area 31c, the number of segments of the radial acquisition is shown. Further, by a button 31d or a button 31e, the processing circuitry 150 can accept from a user an input of the number of the segments of the segmentation of the radial acquisition.

Embodiments are not limited to the example described above. For example, the method of segmentation of the radial acquisition is not limited to the method illustrated in FIG. 9, but other methods of division of segments are possible. For example, as for the methods of division of segments of the radial acquisition, methods of division other than those by sequential division, such as division in an interleaved fashion, may be possible.

As described above, in the fourth embodiment, the first pulse sequence is executed in a plurality of times. By this method, the degree of freedom of configuration of the pulse sequences can be increased and interference between MT pulses of different frequencies can be lessened.

Fifth Embodiment

In the fifth embodiment, a case is explained in which an optimization is performed to the pulse sequence described in the first embodiment. In the fourth embodiment, the radial acquisition is split into a plurality of times of acquisition. In the fifth embodiment, the Cartesian acquisition 3 is split into a plurality of times of acquisition. In other words, in the fifth embodiment, the sequence control circuitry 120 splits the Cartesian sampling in the second pulse sequence into a plurality of times of data acquisition, thereby executing the second pulse sequence.

In the fifth embodiment, the reason the Cartesian acquisition 3 is split into a plurality of times of acquisition and then is executed is the following:

As for the first reason, similarly to the fourth embodiment, by splitting the Cartesian acquisition 3 into a plurality of times of acquisition, the area of the k-space that needs to be acquired at a time can be made to be small. Thus, the degree of freedom in designing the second pulse sequence increases. Similarly to the fourth embodiment, for example, in a case of an imaging of a body part in which $T_1$ is short, such as bones, it becomes necessary to make TE short. However, by splitting the Cartesian acquisition 3 into a plurality of times of acquisition, the choice of pulse sequences available increases. The difference between the fourth embodiment and the fifth embodiment is that, in the fourth embodiment, the degree of freedom in designing the first pulse sequence increases, while in the fifth embodiment, the degree of freedom in designing the second pulse sequence increases.

As for the second reason, as the Cartesian acquisition is split into a plurality of acquisition and MT pulses of the same frequency are applied during the plurality of acquisition in the embodiment, the application interval of MT pulses of different frequencies can be increased. By doing this, similarly to the fourth embodiment, the effect that originates from the influence of the MT pulses of different frequencies contaminating the signal of data acquisition can be mitigated.

Figure 10:
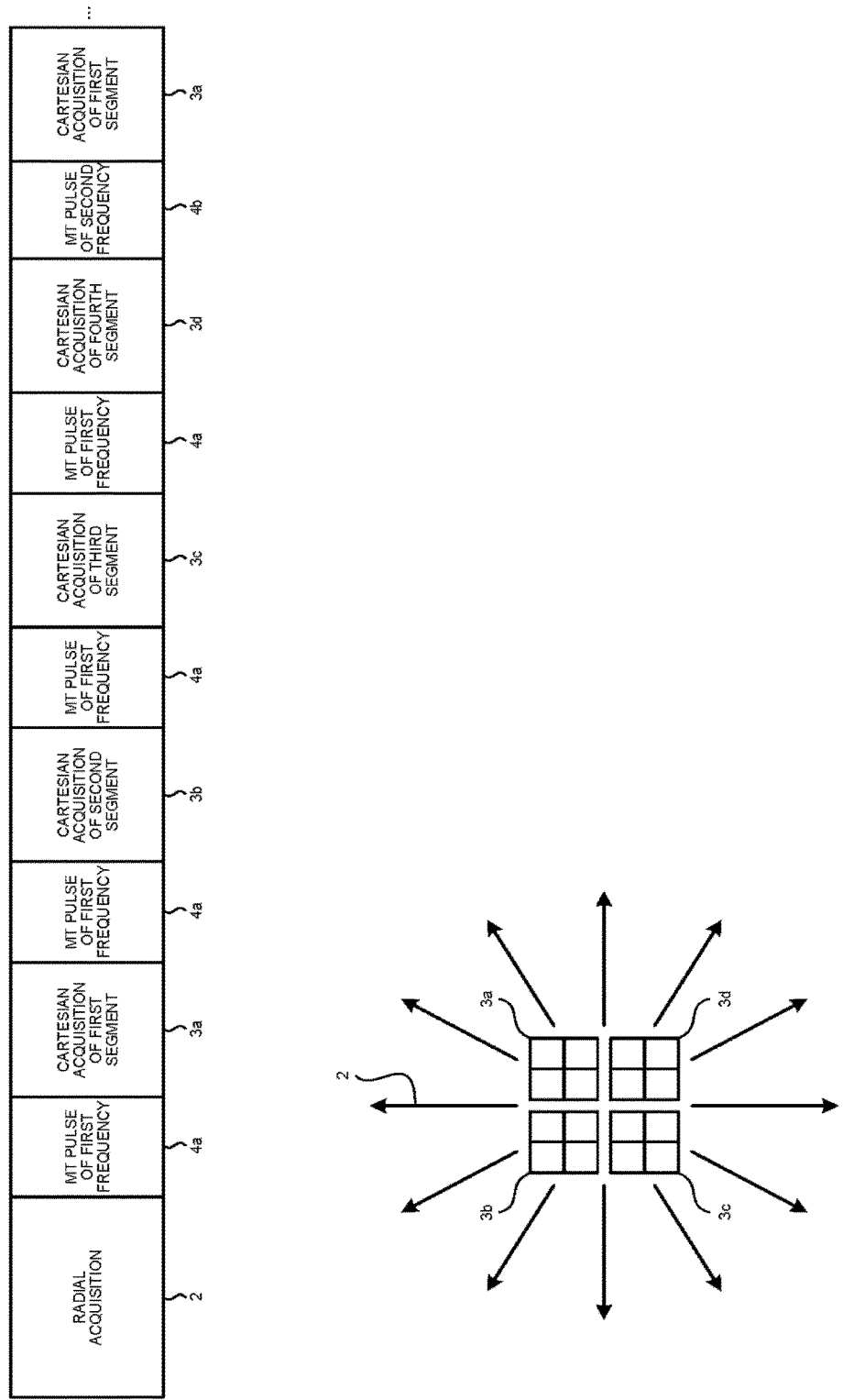
FIG. 10 is a drawing illustrating data acquisition in a fifth embodiment.

An example of the pulse sequence applied in the fifth embodiment is illustrated in FIG. 10. FIG. 10 is a diagram illustrating data acquisition in the fifth embodiment.

In FIG. 10, a Cartesian acquisition 3a, a Cartesian acquisition 3b, a Cartesian acquisition 3c and a Cartesian acquisition 3d are Cartesian acquisition that is acquisition executed in the second pulse sequence. Each of the Cartesian acquisition 3a, the Cartesian acquisition 3b, the Cartesian acquisition 3c and the Cartesian acquisition 3d is Cartesian acquisition of a first segment, of a second segment, of a third segment and of a fourth segment, respectively.

Each an MT pulse 4a and an MT pulse 4b indicates an MT pulse of a first frequency and a second frequency, respectively. Radial acquisition 2 indicates the radial acquisition executed in the first pulse sequence.

In the fifth embodiment, at Step S100, Step S120 and Step S130 in FIG. 4, processing similar to the first embodiment is performed. In processing corresponding to Step S110 in FIG. 4, the sequence control circuitry 120 splits the Cartesian sampling into a plurality of times of sampling to execute the second pulse sequence.

Specifically, as illustrated in FIG. 10, after the sequence control circuitry 120 applies the MT pulse 4a of the first frequency at Step S110, the sequence control circuitry 120 performs the Cartesian acquisition 3a of the first segment. Subsequently, after the sequence control circuitry 120 applies the MT pulse 4a of the first frequency, the sequence control circuitry 120 performs the Cartesian acquisition 3b of the second segment. Subsequently, after the sequence control circuitry 120 applies the MT pulse 4a of the first frequency, the sequence control circuitry 120 performs the Cartesian acquisition 3c of the third segment. Subsequently, after the sequence control circuitry 120 applies the MT pulse 4a of the first frequency, the sequence control circuitry 120 performs the Cartesian acquisition 3d of the fourth segment. Subsequently, after the sequence control circuitry 120 applies the MT pulse 4b of the second frequency, the sequence control circuitry 120 performs the Cartesian acquisition 3a of the first segment again. The sequence control circuitry 120 repeats the operation in the similar manner.

It is noted that embodiments are not limited to the case described above. For example, the processing circuitry 150 calculates, prior to Step S100, based on information and the like on a target to be imaged, how division of segments of a k-space is performed, the k-space being a k-space in which Cartesian sampling is split into a plurality of times of acquisition and executed. Based on the division of the segments calculated by the processing circuitry 150, at Step S110 of FIG. 4, the sequence control circuitry 120 may split the Cartesian sampling in the second pulse sequence into a plurality of times of sampling, thereby executing the Cartesian sampling. For example, the processing circuitry 150 may calculate the number of segments of the k-space in which Cartesian sampling is split into a plurality of times and then is executed, based on a TE suitable for the imaging.

In the panel 45 of FIG. 6, an example of a GUI corresponding to the fifth embodiment is illustrated. By using a button 42a and a button 42b, a user can select whether or not to perform segmentation of the Cartesian acquisition. For example, when a user selects the button 42a, the processing circuitry 150 executes the second pulse sequence by performing segmentation of Cartesian acquisition. Further, in a display area 43, the number of division of the segments of the Cartesian acquisition is illustrated. Further, the processing circuitry 150 may accept an input of the number of segments of the Cartesian acquisition by a button 43a or a button 43b. Further, when a user selects a button 44, the sequence control circuitry 120 executes the second pulse sequence in segments that are divided (that are split) automatically.

Embodiments are not limited to the examples described above. For example, how the Cartesian acquisition is split into segments is not limited to the method illustrated in FIG. 10, but other methods of division are possible. Further, for example, the second pulse sequence is not limited to the case described above. For example, a case is explained in which the frequency of the MT pulse is fixed and a series of acquisition is performed by changing the segments such as performing acquisition in the time order of the Cartesian acquisition 3a of the first segment, the Cartesian acquisition 3b of the second segment and the like. However, embodiments are not limited to this example. For example, it is possible to execute the second pulse sequence by first fixing a Cartesian segment and changing the frequency of the MT pulse and subsequently by performing acquisition of the next Cartesian segment after all the acquisition of the Cartesian segment is completed. Further, the fourth embodiment and the fifth embodiment may be combined. In other words, both of the radial acquisition and the Cartesian acquisition may be combined.

As described above, in the fifth embodiment, Cartesian sampling is split into a plurality of acquisition and then executed. With this method, the degree of freedom in designing the pulse sequence is increased and the interference between MT pulses of different frequencies can be lessened.

Computer Programs

Further, the instructions presented in the processing procedures described in the above embodiments may be executed according to a computer program (hereinafter, "program") that is software. It is possible to achieve the same advantageous effects as those from the magnetic resonance imaging apparatus 100 in the above embodiments, by causing a general-purpose computer to store the program therein in advance and to read the program. The instructions described in the above embodiments are recorded as a computer-executable program onto a magnetic disk (e.g., a flexible disk, a hard disk), an optical disc (e.g., a Compact Disc Read-Only Memory [CD-ROM], a Compact Disc Recordable [CD-R], a Compact Disc Rewritable [CD-RW], a Digital Versatile Disk Read-Only Memory [DVD-ROM], a Digital Versatile Disk Recordable [DVD±R], a Digital Versatile Disk Rewritable [DVD±RW]), a semiconductor memory, or the like. Any storage format can be used, as long an a computer or an incorporated system is able to read data from the storage medium. The computer is able to realize the same operations as those performed by the magnetic resonance imaging apparatus 100 described in the above embodiments, by reading the program from the recording medium and having the CPU execute the instructions written in the program according to the read program. Further, when obtaining or reading the program, the computer may obtain or read the program via network.

Further, according to the instructions in the program installed from the storage medium into the computer or the incorporated system, an Operating System (OS) working in the computer, middleware (MW) such as database management software or a network may execute a part of the processes performed for realizing the embodiments described above. Further, the storage medium does not necessarily have to a medium that is independent of the computer or the incorporated system. The storage medium may be such a storage medium that stores therein or temporarily stores therein the downloaded program transferred via a Local Area Network (LAN), the Internet, or the like. Further, the storage medium does not necessarily have to be one. Even the situation where the processes described in the above embodiments are executed from a plurality of media is included in possible modes of the storage medium implementing the embodiments. The medium/media may have any configuration.

Further, the computer or the incorporated system used in any of the embodiments is configured to execute the processes described in the above embodiments according to the program stored in the storage medium. The computer or the incorporated system may be configured by using a single apparatus such as a personal computer or a microcomputer or may be configured by using a system in which a plurality of apparatuses are connected together via a network. Furthermore, the computer used in any of the embodiments does not necessarily have to be a personal computer and may be an arithmetic processing apparatus, a microcomputer, or the like included in an information processing device. The term "computer" generally refers to any device or apparatus that is capable of realizing the functions described in the embodiments by using the program.

A Hardware Configuration

Figure 11:
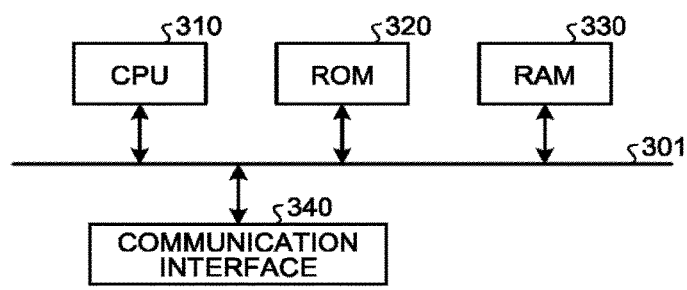
FIG. 11 is a drawing illustrating an image processing apparatus according to an embodiment.

FIG. 11 is a diagram of a hardware configuration of a computer 130 (image processing apparatus) according to an embodiment. The image processing apparatus according to the embodiments described above includes a controlling device such as a Central Processing Unit (CPU) 310, storage devices such as a Read-Only Memory (ROM) 320 and a Random Access Memory (RAM) 330, a communication interface (I/F) 340 that connects to a network and performs communication, and a bus 301 that connects the units together.

The program executed by the image processing apparatus according to the embodiments described above is provided as being incorporated, in advance, in the ROM 320 or the like. Further, the program executed by the image processing apparatus according to the embodiments described above is able to cause the computer to function as the units of the image processing apparatus described above. The computer is configured so that the CPU 310 is able to read the program from a computer-readable storage medium into a main storage device and to execute the read program.

According to a magnetic resonance imaging apparatus and a magnetic resonance imaging method, the CEST imaging can be performed in a short imaging time.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising:
   sequence control circuitry configured to execute a first pulse sequence that acquires data by radial sampling and configured to execute a second pulse sequence a plurality of times by changing a frequency of magnetization transfer (MT) pulses, the second pulse sequence acquiring data by Cartesian sampling after applying an MT pulse, and
   processing circuitry configured to calculate a spectrum based on data acquired from the first pulse sequence and the second pulse sequence.

2. The magnetic resonance imaging apparatus according to claim 1, wherein the sequence control circuitry is further configured to apply a fat saturation pulse in the second pulse sequence.

3. The magnetic resonance imaging apparatus according to claim 1, wherein
   the processing circuitry is configured to calculate an area of a k-space in which data acquisition is performed by the Cartesian sampling, and
   the sequence control circuitry is configured to acquire data by the Cartesian sampling in the area of the k-space calculated by the processing circuitry.

4. The magnetic resonance imaging apparatus according to claim 1, wherein
   the sequence control circuitry is configured to split the first pulse sequence into a plurality of times of acquisition, thereby executing the first pulse sequence.

5. The magnetic resonance imaging apparatus according to claim 1, wherein
   the sequence control circuitry is configured to split the Cartesian sampling in the second pulse sequence into a plurality of times of acquisition, thereby executing the second pulse sequence.

6. The magnetic resonance imaging apparatus according to claim 5, wherein
   the processing circuitry configured to calculate, based on information on a target to be imaged, how division of segments of a k-space is performed, the k-space being a k-space in which the Cartesian sampling is split into a plurality of times of acquisition and executed, and the sequence control circuitry is configured to split, based on the division of the segments calculated by the processing circuitry, the Cartesian sampling in the second pulse sequence into a plurality of times of sampling, thereby executing the Cartesian sampling.

7. The magnetic resonance imaging apparatus according to claim 1, wherein the spectrum indicates an amount of CEST effect.

8. The magnetic resonance imaging apparatus according to claim 7, wherein the processing circuitry is configured to accept an input of a selection of a region of interest (ROI) from a user and configured to calculate the spectrum based on the input accepted.

9. The magnetic resonance imaging apparatus according to claim 1, wherein the sequence control circuitry is configured to perform the radial sampling in the first pulse sequence by using golden-angle sampling pattern.

10. A magnetic resonance imaging method executed in a magnetic resonance imaging apparatus including:
- executing a first pulse sequence that acquires data by radial sampling;
- executing a second pulse sequence a plurality of times by changing a frequency of magnetization transfer (MT) pulses, the second pulse sequence acquiring data by Cartesian sampling after applying an MT pulse; and
- calculating a spectrum based on data acquired from the first pulse sequence and the second pulse sequence.

* * * * *